United States Patent
Aarabi

(10) Patent No.: US 10,892,166 B2
(45) Date of Patent: *Jan. 12, 2021

(54) SYSTEM AND METHOD FOR LIGHT FIELD CORRECTION OF COLORED SURFACES IN AN IMAGE

(71) Applicant: L'Oreal, Paris (FR)

(72) Inventor: Parham Aarabi, Ontario (CA)

(73) Assignee: L'Oreal, Paris (FR)

(*) Notice: Subject to any disclaimer, the term of this patent is extended or adjusted under 35 U.S.C. 154(b) by 0 days.

This patent is subject to a terminal disclaimer.

(21) Appl. No.: 16/588,723

(22) Filed: Sep. 30, 2019

(65) Prior Publication Data

US 2020/0027744 A1    Jan. 23, 2020

Related U.S. Application Data

(63) Continuation of application No. 15/425,326, filed on Feb. 6, 2017, now Pat. No. 10,565,741.

(51) Int. Cl.

| G06T 11/00 | (2006.01) |
|---|---|
| H01L 21/308 | (2006.01) |
| H01L 21/268 | (2006.01) |
| G03F 7/20 | (2006.01) |
| G03F 1/50 | (2012.01) |
| G03F 1/54 | (2012.01) |

(52) U.S. Cl.
CPC ............ *H01L 21/3081* (2013.01); *G03F 1/50* (2013.01); *G03F 7/70* (2013.01); *G03F 7/70008* (2013.01); *G03F 7/70325* (2013.01); *G06T 11/00* (2013.01); *H01L 21/268* (2013.01); *G03F 1/54* (2013.01)

(58) Field of Classification Search
CPC .......... G06T 11/001; G06T 7/90; G06T 15/50
See application file for complete search history.

(56) References Cited

U.S. PATENT DOCUMENTS

| 6,810,130 | B1 | 10/2004 | Aubert |
|---|---|---|---|
| 6,937,755 | B2 | 8/2005 | Orpaz et al. |
| 9,449,412 | B1 | 9/2016 | Rogers et al. |
| 9,460,462 | B1 | 10/2016 | Walker et al. |
| 9,495,582 | B2 | 11/2016 | Guissin et al. |
| 9,542,599 | B2 | 1/2017 | Matsunaga et al. |

(Continued)

FOREIGN PATENT DOCUMENTS

| EP | 2 985 732 A1 | 2/2016 |
|---|---|---|
| WO | WO 2015/144563 A1 | 10/2015 |

OTHER PUBLICATIONS

European Extended Search Report for corresponding European Patent Application No. 18 15 3773 dated Jun. 5, 2018.

(Continued)

*Primary Examiner* — Antonio A Caschera
(74) *Attorney, Agent, or Firm* — Oblon, McClelland, Maier & Neustadt, L.L.P.

(57) ABSTRACT

A computer-implemented method for correcting a makeup or skin effect to be rendered on a surface region of an image of a portion of a body of a person. The method and system correcting the makeup or skin effect by accounting for image-specific light field parameters, such as a light profile estimate and minimum light field estimation, and rendering the corrected the makeup or skin effect on the image to generate a corrected image.

25 Claims, 2 Drawing Sheets

(56) References Cited

U.S. PATENT DOCUMENTS

| | | |
|---|---|---|
| 9,547,883 B1 | 1/2017 | Stepanenko |
| 9,750,326 B2 | 9/2017 | Yoshida |
| 10,565,741 B2 * | 2/2020 | Aarabi .................. G06T 11/001 |
| 2015/0145882 A1 | 5/2015 | Nguyen et al. |
| 2016/0042557 A1 | 2/2016 | Lin |
| 2016/0106198 A1 | 4/2016 | Yoshida et al. |

OTHER PUBLICATIONS

Preliminary Search Report and Written Opinion dated Sep. 5, 2019 in French Application No. FR1752547.

* cited by examiner

SYSTEM AND METHOD FOR LIGHT FIELD CORRECTION OF COLORED SURFACES IN AN IMAGE

CROSS-REFERENCE

This application is a continuation of U.S. patent application Ser. No. 15/425,326 filed Feb. 6, 2017 the entire disclosure of which is herein incorporated herein by reference.

FIELD

The present subject matter relates to a system and method for correcting a makeup or skin effect to be rendered on a surface region of an image of a portion of a body of a person.

BACKGROUND

The importance of properly being able to see the accurate color of makeup in multiple lighting conditions is a crucial aspect in a beauty routine. While makeup may look great in the artificial light of a bathroom, under natural light a person may discover that their foundation is too dark and the shade of lipstick does not flatter their skin tone. These errors that could have been prevented by allowing a person to try on makeup in a digital image, where that makeup has been corrected for the lighting environment of the image.

For example, while the color of the red lipstick may look deep and muted in a bedroom with warm lighting, when walking outside the color changes to vibrant and bright. Another example is the color of lipstick a woman wants to wear has to match the color of the dress that is being worn. Being able to see what the color will look like in multiple sets of lighting makes it easier for a person to pick a shade that will flatter their skin tone in all lightings, but also ensures the person has spent their time and money wisely.

The same color under different lighting conditions can render very differently. Furthermore, the same chemical texture (which has a specific chemical composition and texture/finish) will reflect light differently under different lighting situations.

U.S. Pat. No. 9,495,582 entitled "Digital Makeup" and published/issued Nov. 15, 2016 discloses a system that utilizes a combination of low-pass, band-pass, and high-pass filters to de-noise a facial image. However, U.S. Pat. No. 9,495,582 does not disclose any method for the simulation of color layers on an image, preserving the texture of the underlying surface on which a color is simulated, or a model for the dynamic adjustment of a coloring layer in order to simulate a realistic color under different lighting conditions.

U.S. Pat. No. 9,547,883 entitled "Systems And Methods For Dewarping Images" and published/issued Jan. 17, 2017 discloses a system for dewarping image distortions caused by wide angle lenses. U.S. Pat. No. 9,547,883 does not disclose any method for the simulation of color layers on an image, preserving the texture of the underlying surface on which a color is simulated, or a model for the dynamic adjustment of a coloring layer in order to simulate a realistic color under different lighting conditions.

U.S. Pat. No. 9,542,599 entitled "Image Processing Device And Image Processing Method" and published/issued Jan. 10, 2017 discloses a system for the removal of halations around a pupil in a digital photo. U.S. Pat. No. 9,542,599 does not disclose any method for the simulation of a makeup color layer on an image, preserving the texture of the underlying surface on which a color is simulated, or a model for the dynamic adjustment of a coloring layer in order to simulate a realistic color under different lighting conditions.

U.S. Pat. No. 9,449,412 entitled "Adaptive, Calibrated Simulation Of Cosmetic Products On Consumer Devices" and published/issued Sep. 20, 2016 discloses a system for the simulation of cosmetic products on images. U.S. Pat. No. 9,449,412 does not disclose a non-linear light-field based transformation of the light value, nor does it disclose the estimation of the minimum light pixels which are essential for the light value transformation. Finally, U.S. Pat. No. 9,449,412 discloses only pixel-wise adjustments, but not region based adjustments as disclosed in this document.

U.S. Pat. No. 9,460,462 entitled "Monetization Using Video-Based Simulation Of Cosmetic Products" and published/issued Oct. 4, 2016 discloses a system for vending makeup products. U.S. Pat. No. 9,460,462 does not disclose any method for preserving the texture of the underlying surface on which a color is simulated, or a model for the dynamic adjustment of a coloring layer in order to simulate a realistic color under different lighting conditions.

SUMMARY

In accordance with the present disclosure, provided is a system and method for correcting a makeup or color effect to be rendered on a surface region of an image of a person which accounts for the lighting environment of the image and enables a layer of color to be rendered accurately in different lighting conditions (e.g. low-light, high intensity light, etc.).

As a corollary, adjusting the rendering of the color layer based on light field parameters can help users determine which shade of makeup will closely match in all sets of lighting without having to buy and sample multiple shades which can become costly and unrealistic.

Disclosed is a method for correcting a makeup or skin effect to be rendered on a surface region of an image of a portion of a body of a person; calculating a light intensity estimate of the image as an average color of pixels in a first region of the image; calculating a minimum light field estimate of the image as the minimum color of pixels in a second region of the image; receiving visual rendering parameters of the makeup or skin effect; correcting the visual rendering parameters of the makeup or skin effect through a non-linear transformation accounting for the light intensity estimate and the minimum light field estimate to generate a light field corrected makeup or skin effect; rendering the light field corrected makeup or skin effect on the surface region to generate a corrected image; and providing the corrected image for display.

The portion of a body of a person may be any portion of the body, such as a face, hair or skin. The exemplary embodiment of the method disclosed herein is specific to a face, however it is envisioned that the method may be applied to any body part.

The method may comprise receiving a video frame as the image.

The first region of the image may comprise a face region of the person.

The second region of the image may comprise an eye region of the person.

There is provided a computer system comprising at least one processor and a memory storing instructions and data, which when executed by the processor, cause the computer system to perform at least one of the methods described.

Also provided is a non-transitory computer readable medium storing instructions that, when executed by a computer, cause the computer to carry at least one of the methods described.

BRIEF DESCRIPTION OF THE DRAWINGS

Exemplary embodiments of the subject matter will now be described in conjunction with the following drawings, by way of example only, in which.

DETAILED DESCRIPTION

As further described below with reference to FIGS. 1 and 2, a system and computer-implemented method for light field correction of colored surfaces in an image is provided. Such a system and method may be useful to correct a makeup or skin effect to be rendered on a surface region of an image 100 of a portion of a body of a person, which accounts for a light field of the image.

The method outlined in this disclosure is implemented on a computer utilizing at least one processor and memory (or other non-transitory computer readable medium) associated with the computer. The memory may store instructions and/or data to configure the at least one processor during execution and hence the computer to provide and/or perform the methods described herein. The instructions may be configured as software such as a native application or browser-based application. The computer may be coupled for communication, whether locally such as via a bus or remotely such as via a network, to one or more storage devices, image and/or video capturing devices (e.g. a camera) and other devices or services (e.g. via the Web). One exemplary embodiment is the utilization of a mobile device using either static images or a real-time live video feed which is processed frame by frame. The mobile device may comprise the camera. Another exemplary embodiment is a browser executing on a computer which simulates makeup shades on static images or real-time live video feed processed frame by frame. Another exemplary embodiment is an in store "magic" mirror which simulates makeup on a real-time live video feed processed frame by frame.

The proposed method could be employed in any number of color spaces (RGB, HSV, HSL, LAB, CMYK, etc). For the purposes of simplicity, the following calculations are based on the HSV domain. However, it is noted that anyone familiar with the art will be able to replicate these equations in different color spaces.

The following derivations assume an RGB scale in the 0-255 range per channel and an HSV scale with a 0-1 scale for S and V channel.

In this disclosure a reference to a color means the color for a single region which is determined by averaging the colors of that region. A region could be as small as a single pixel, but could consist of a group of pixels constituting a single coloring region. A region on the image which is to be colored with the new coloring layer has an average base color for the region defined by H for hue, S for saturation, and V for value.

Figure 1:
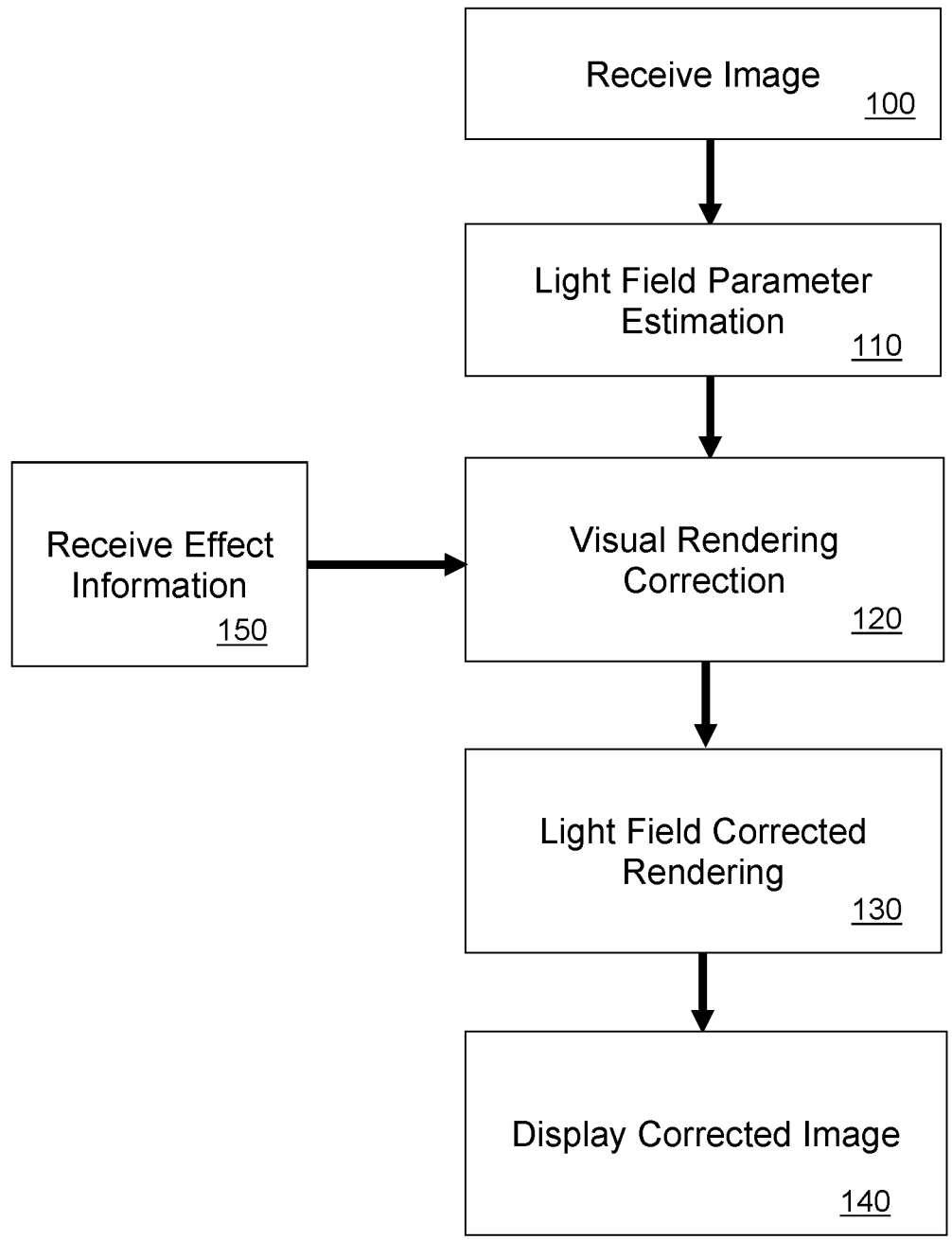
FIG. 1 is a flow chart showing a method for light field correction of colored surfaces in an image as a sequence of steps with inputs in accordance with an embodiment.

With reference to FIG. 1, there is shown a flow chart showing a method for light field correction of colored surfaces in an image 100. The received image 100 can be provided from a camera, storage, or other image source. The image may be a single image format or video format. At 110, light field parameter estimation is performed. At 120, Visual rendering correction is performed, utilizing received effect information 150. At 130, light field corrected rendering is performed on the received image with the effect and at 140 the corrected image with the effect is displayed. Steps 110, 120, 130 in particular are described further with respect to FIG. 2.

The received effect information 150 can be a makeup effect, a skin effect, or any other color effect. The received effect information 150 can be provided by a user, storage or any other effect source.

Figure 2:
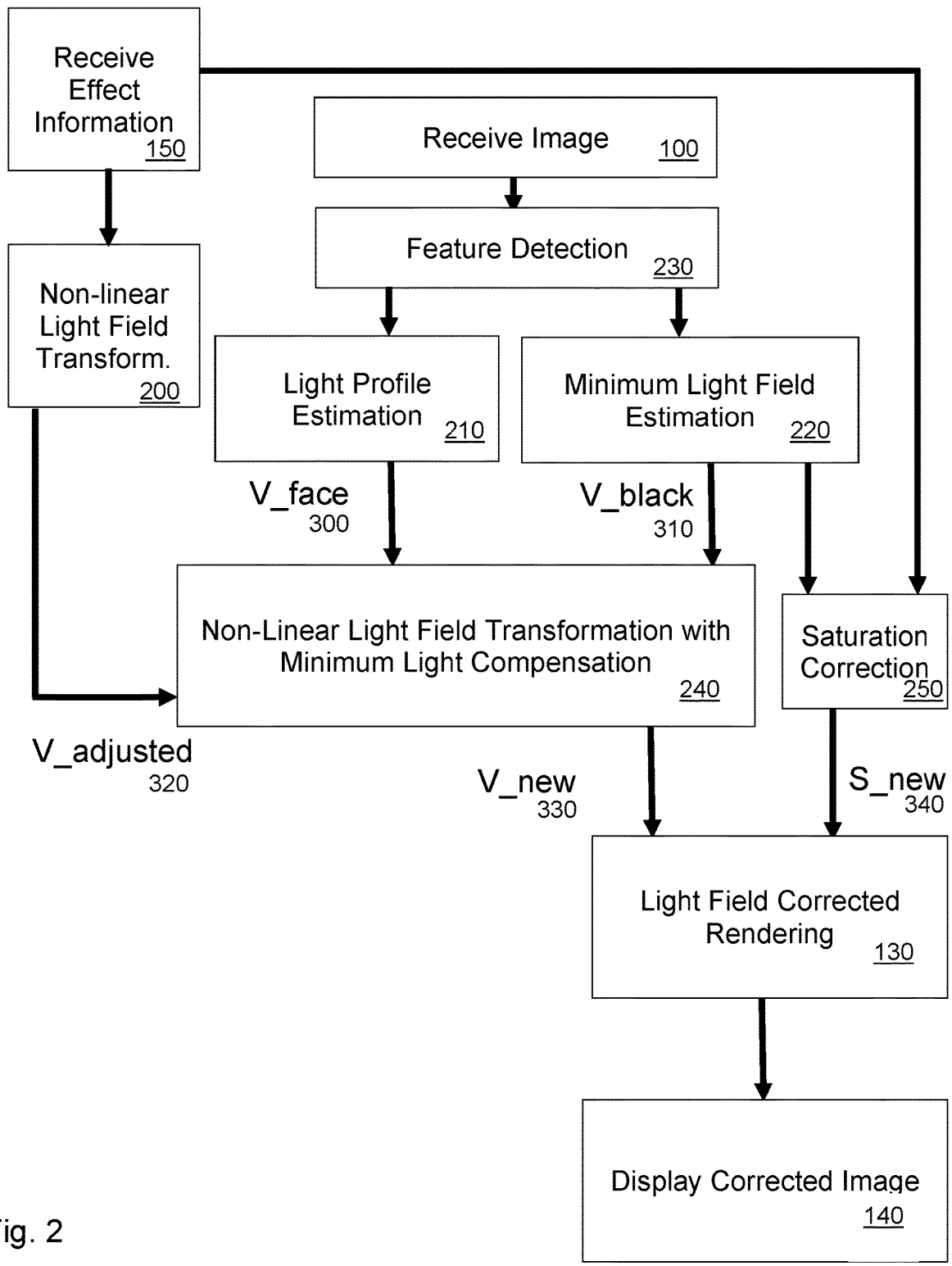
FIG. 2 is a flow chart showing in greater detail the method shown in FIG. 1, in accordance with an embodiment.

With reference to FIG. 2 and in brief, the exemplary embodiment of the correction of the makeup or skin effect proceeds by the following steps: (1) feature detection 230 of the face and facial features of the images, (2) calculating the light field parameter estimation comprising calculating the light profile estimation 210 of the image, and calculating the minimum light field estimation 220 of the image, (3) receiving the color effect 150 that is to be applied to the image, (4) applying a non-linear light field transformation 200 to the intensity of the color effect, (5) applying the non-linear light field transformation with minimum light compensation 240 to the intensity of the color effect, (6) applying the saturation correction 250 of the color effect, (7) light field corrected rendering 130 of the received effect 150 on the image 100 to generate a corrected image, and (8) displaying the corrected image 140. In terms of FIG. 1, light field parameter estimation 110 is detailed as step 2 following preliminary processing of step 1 and visual correction rendering 120 is detailed as steps 4-6.

Step one in the exemplary embodiment is feature detection 230 of the face and facial features within the image. This can be accomplished by gradient-based methods, template-based methods, or other methods to determine the specific location of the face and facial features such as the eyes, nose, and lips. The skin regions of the face can then be detected, from which the color of the skin could be determined by averaging the pixels within the skin region.

Step two in the exemplary embodiment is the calculation of the light field parameter estimation 110, comprising the light profile estimation 210 and the minimum light field estimation 220.

In the exemplary embodiment calculation of the light profile estimation 210. This is determined by defining V_face 300 as the value of the average face color. V_face 300 could also be determined from other intrinsic parameters of a photo in order to get a reading on the lighting of the environment. For example, V_face 300 could be determined from the shine on the hair, by using the extreme of shine and shadow on the hair to provide a method to calibrate the face color value V_face (e.g. compute V_face on a scale between the smallest V and largest V on the hair and remap it to a normalized scale). V_face 300 could also be obtained using the average lighting in the background similarly by using the minimum and maximum values (or other statistical measures) to calibrate the average skin pixels from which V_face is estimate. In fact, V_face could be determined through the calibration of any source of lighting measurement, including from the background, the hair, or the face, or a combination of any or all of the them.

In the exemplary embodiment the method assesses the low-light camera contrast adjustments through the calculation of the minimum light field estimation 220. V_black 310 is defined as the lowest V value around the eyes (which is one method of estimating the minimum light value of the face). This is done by searching a region of pixels around the eyes, finding the pixel or region which has the smallest V value parameter and defining that to be V_black 310. V_black 310 could also be defined as the minimum V value around the face, or throughout the whole image as well. It is a measure of the minimum V value which can be determined by various image and camera parameters by observing the minimum V value within a region which is expected to contain a black color (expecting an ideal V_black of 0, though in practice V_black may be higher than 0 due to the lighting of the image/video frame). In fact, having a face or facial features within the region is not a requirement, though knowledge of the facial features (such as the black color of the lashes or the shadows in the nose provides useful target regions for estimating V_black) is assistive.

Step three in the exemplary embodiment is receiving the effect information 150, which may be a makeup effect, skin effect, or other color effect that is to be applied to the image. The color of this effect that is intended to be rendered at the current region is defined as having a hue of H_original, a saturation of S_original, and a value of V_original.

Step four of the exemplary embodiment is to apply a non-linear light field transformation 200 to the intensity of the color, calculated as a scaled value parameter defined below, which is used to calculate the adjusted intensity of the color, V_adjusted 320:

$$V\_adjusted = V\_original * (1 - V\_original * c\_1)$$

In the above equation, c_1 is a value distortion correcting constant factor in the 0-1 range. A preferred value of c_1 is in the 0.4 to 0.9 range. This adjustment is applied since the color that is intended to be rendered is usually parametrized in a brighter setting than the lighting conditions where the image is captured.

Step five of the exemplary embodiment is to apply a non-linear light field transformation with minimum light compensation 240 to calculate the new intensity of the color to be rendered on the image. The color is adjusted to correct any low-light contrast issues in the image or video frame. V_new 330 is calculated based on the following non-linear set of equations:

$$\text{if } (V\_face > V\_black) \&\& (c\_2 > V\_black) \&\& (V\_adjusted > V\_black)$$

$$V\_new = (V\_adjusted - V\_black) * (V\_face - V\_black) / (c\_2 - V\_black) + V\_black$$

else $$V\_new = V\_black$$

In the above equations, c_2 is a base value limit in the 0-1 range. A preferred value of c_2 is in the 0.3 to 0.8 range. The non-linear transformations defined above include the V_black 310 minimum light value parameter. This provides a unique distinction with other color adjustment methods such as the one disclosed in U.S. Pat. No. 9,449,412, which neither utilizes a non-linear light value transformation nor estimates the minimum light value parameter which is critical in the non-linear light-value transformation.

Step six of the exemplary embodiment is to apply the saturation correction 250 to the saturation value of the received effect information 150, as the saturation of the received color effect 150 can also be affected by the light field. In the exemplary embodiment this is a non-linear transformation accounting for minimum light. The corrected saturation value S_new 340 is calculated using the following equation:

$$S\_new = S\_original * \max(0, 1 - V\_black / c\_3)$$

In the above equation, c_3 is a saturation compensation scaling value in the 0-1 range. A preferred value of c_3 is in the 0.4 to 1.0 range.

The corrected color value that is rendered on the image is defined by H_original, S_new 340, and V_new 330.

Step seven of the exemplary embodiment is the light field corrected rendering 130 of the received effect information 150 on the image 100. This is accomplished by replacing the original H, S, and V of the pixels in the current region of the image with the corrected color values H_original, S_new 340, and V_new 340, respectively. Again, a region could be as small as a pixel, or could be a group of pixels whose average H, S, and V values would be replaced by H_original, S_new 340, and V_new 330. Further enhancements could be obtained by a more complex lighting model for H, S, and V, including how each of these are affected by lighting.

This process is then repeated for all other regions of the received image 100 where a received color effect 150 is to be applied.

The color in one or more regions of the image 100 is replaced by the corrected coloring value, thereby creating a corrected image. This corrected image can be stored in computer memory and/or displayed 140 to the user via a screen or display. If the corrected image is a video frame, the resulting video frame can be displayed 140 and/or stored as part of a group of video frames.

It should be apparent to those skilled in the art that the description and Figures are merely illustrative and not limiting. They are presented by way of example only. Modifications and other embodiments are within the scope of one of ordinary skill in the art and are contemplated as falling within the claimed subject matter.

What is claimed is:

1. A computer-implemented method for correcting a makeup or skin effect to be rendered on a surface region of an image of a portion of a body of a person, which accounts for a light field of the image, the method comprising:
    calculating a light intensity estimation of the image as an average light intensity of pixels in a first region of the image;
    determining a minimum light field estimation of the image as a minimum light intensity of pixels in a second region of the image;
    receiving color effect parameters of the makeup or skin effect;
    correcting the color effect parameters through a non-linear transformation accounting for the light intensity estimation and the minimum light field estimate to generate a light field corrected makeup or skin effect;
    rendering the light field corrected makeup or skin effect on the surface region to generate a corrected image; and
    displaying the corrected image.

2. The method of claim 1 wherein the image is a video frame.

3. The method of claim 1 wherein the portion of the body of the person includes a face.

4. The method of claim 3 wherein the first region of the image comprises a face region of the person.

5. The method of claim 3 wherein the second region of the image comprises an eye region of the person.

6. The method of claim 1, further comprising performing feature detection within the image to determine the first region and the second region.

7. The method of claim 1, wherein the step of correcting the color effect parameters comprises:
   applying a non-linear light field transformation to an intensity parameter of the color effect parameters, using a scaled value to determine an adjusted value of an original value of the intensity parameter;
   applying a non-linear light field transformation responsive to the light intensity estimation, the minimum light field estimation and the adjusted value to determine a new value to use for the intensity parameter; and
   applying a saturation correction to a saturation parameter of the color effect parameters, where the saturation correction is a non-linear transformation responsive to the minimum light field estimation.

8. The method of claim 7 wherein:
   the light intensity estimation for the first region is defined as $V\_1^{st}\text{region}$;
   the minimum light filed estimation for the second region is defined as V_black;
   the adjusted value of the intensity parameter is defined as V_adjusted; and
   the new value to use for the intensity parameter is defined as V_New in accordance with a definition:

If $(V\_1^{st}\text{region} > V\_\text{black}) \&\& (c\_2 > V\_\text{black}) \&\& (V\_\text{adjusted} > V\_\text{black})$ $V\_new = (V\_adjusted - V\_black) * (V\_1^{st}\text{region} - V\_black)/(c\_2 - V\_black) + V\_black;$ else $V\_new = V\_black;$ where c_2 is a base value limit in a 0-1 range.

9. The method of claim 7, wherein the minimum light filed estimation for the second region is defined as V_black and the saturation correction defines a new saturation value S_New for an original value S_Original of the saturation parameter in accordance with a definition:

$S\_new = S\_original * \max(0, 1 - V\_black/c\_3);$ where c_3 is a saturation compensation scaling value in a 0-1 range.

10. The method of claim 1 wherein the second region of the image is an eye region and the step of determining a minimum light field estimation of the image comprises searching around the eye region to find a pixel or region of pixels which has a smallest light intensity value with which to define the minimum light field estimation.

11. A computer system for correcting a makeup or skin effect to be rendered on a surface region of an image of a portion of a body of a person, which accounts for a light field of the image, the system comprising at least one processor coupled to memory storing instructions and data, which when executed by the processor, cause the computer system to:
   calculate a light intensity estimation of the image as an average light intensity of pixels in a first region of the image;
   determine a minimum light field estimation of the image as a minimum light intensity of pixels in a second region of the image;
   receive color effect parameters of the makeup or skin effect;
   correct the color effect parameters of the makeup or skin effect through a non-linear transformation accounting for the light intensity estimation and the minimum light field estimation to generate a light field corrected makeup or skin effect;
   render the light field corrected makeup or skin effect on the surface region to generate a corrected image; and
   display the corrected image.

12. The system of claim 11 wherein the image is a video frame.

13. The system of claim 11 wherein the portion of the body of the person includes a face.

14. The system of claim 13 wherein the first region of the image comprises a face region of the person.

15. The system of claim 13 wherein the second region of the image comprises an eye region of the person.

16. The system of claim 11, wherein the instructions, when executed by the processor, cause the computer system to further perform feature detection within the image to determine the first region and the second region.

17. The system of claim 11, wherein to correct the color effect parameters comprises:
   applying a non-linear light field transformation to an intensity parameter of the color effect parameters using a scaled value to determine an adjusted value of an original value of the intensity parameter;
   applying a non-linear light field transformation responsive to the light intensity estimation, the minimum light field estimation and the adjusted value to determine a new value to use for the intensity parameter; and
   applying a saturation correction to a saturation parameter of the color effect parameters where the saturation correction is a non-linear transformation responsive to the minimum light field estimation.

18. The system of claim 17 wherein:
   the light intensity estimation for the first region is defined as $V\_1^{st}\_\text{region}$;
   the minimum light filed estimation for the second region is defined as V_black;
   the adjusted value of the intensity parameter is defined as V_adjusted; and
   the new value to use for the intensity parameter is defined as V_New in accordance with a definition:

If $(V\_1^{st}\_\text{region} > V\_\text{black}) \&\& (c\_2 > V\_\text{black}) \&\& (V\_\text{adjusted} > V\_\text{black})$ $V\_new = (V\_adjusted - V\_black) * (V\_1^{st}\_\text{region} - V\_black)/(c\_2 - V\_black) + V\_black;$ else $V\_new = V\_black;$ where c_2 is a base value limit in a 0-1 range.

19. The system of claim 17, wherein the minimum light filed estimation for the second region is defined as V_black and the saturation correction defines a new saturation value S_New for an original value S_Original of the saturation parameter in accordance with a definition:

$S\_new = S\_original * \max(0, 1 - V\_black/c\_3);$ where c_3 is a saturation compensation scaling value in a 0-1 range.

20. A non-transitory computer readable medium storing instructions that, when executed by a processor of a computer, cause the computer to carry out the following:
   calculating a light intensity estimation of an image of a portion of a body of a person as an average light intensity of pixels in a first region of the image;

determining a minimum light field estimation of the image as a minimum light intensity of pixels in a second region of the image;

receiving color effect parameters of a makeup or skin effect;

correcting the color effect parameters through a non-linear transformation accounting for the light intensity estimation and the minimum light field estimate to generate a light field corrected makeup or skin effect;

rendering the light field corrected makeup or skin effect on a surface region of the portion of the body to generate a corrected image; and displaying the corrected image.

21. The non-transitory computer readable medium of claim 20, wherein the instructions, when executed by the processor, cause the computer to further perform feature detection within the image to determine the first region and the second region.

22. The non-transitory computer readable medium of claim 20, wherein the first region of the image comprises a face region of the person and the second region comprises a facial feature region within the face region.

23. The non-transitory computer readable medium of claim 20, wherein correcting the color effect parameters comprises:

applying a non-linear light field transformation to an intensity parameter of the color effect parameters using a scaled value to determine an adjusted value of an original value of the intensity parameter;

applying a non-linear light field transformation responsive to the light intensity estimation, the minimum light field estimation and the adjusted value to determine a new value to use for the intensity parameter; and applying a saturation correction to a saturation parameter of the color effect parameters where the saturation correction is a non-linear transformation responsive to the minimum light field estimation.

24. The non-transitory computer readable medium of claim 23 wherein:

the light intensity estimation for the first region is defined as $V\_1^{st}\_region$;

the minimum light filed estimation for the second region is defined as $V\_black$;

the adjusted value of the intensity parameter is defined as $V\_adjusted$; and the new value to use for the intensity parameter is defined as $V\_New$ in accordance with a definition:

If $(V\_1^{st}\_region > V\_black)\&\&(c\_2 > V\_black)\&\& (V\_adjusted > V\_black)$ $V\_new = (V\_adjusted - V\_black)*(V\_1^{st}\_region - V\_black)/(c\_2 - V\_black) + V\_black;$ else $V\_new = V\_black;$ where $c\_2$ is a base value limit in a 0-1 range.

25. The non-transitory computer readable medium of claim 23, wherein the minimum light filed estimation for the second region is defined as $V\_black$ and the saturation correction defines a new saturation value $S\_New$ for an original value $S\_Original$ of the saturation parameter in accordance with a definition:

$S\_new = S\_original * \max(0, 1 - V\_black/c\_3);$ where $c\_3$ is a saturation compensation scaling value in a 0-1 range.

* * * * *